(12) United States Patent
Takeda et al.

(10) Patent No.: US 11,921,324 B2
(45) Date of Patent: Mar. 5, 2024

(54) PHOTODETECTOR

(71) Applicant: Nippon Telegraph and Telephone Corporation, Tokyo (JP)

(72) Inventors: Kotaro Takeda, Musashino (JP); Yusuke Nasu, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 517 days.

(21) Appl. No.: 17/057,600

(22) PCT Filed: May 15, 2019

(86) PCT No.: PCT/JP2019/019315
§ 371 (c)(1),
(2) Date: Nov. 20, 2020

(87) PCT Pub. No.: WO2019/225439
PCT Pub. Date: Nov. 28, 2019

(65) Prior Publication Data
US 2021/0199888 A1    Jul. 1, 2021

(30) Foreign Application Priority Data
May 21, 2018    (JP) .................. 2018-097211

(51) Int. Cl.
*G02B 6/126*    (2006.01)
*H01L 31/0224*    (2006.01)
*H01L 31/101*    (2006.01)
(52) U.S. Cl.
CPC ...... *G02B 6/126* (2013.01); *H01L 31/022408* (2013.01); *H01L 31/1013* (2013.01)
(58) Field of Classification Search
CPC .................. G02B 6/126; G02B 6/00
(Continued)

(56) References Cited

U.S. PATENT DOCUMENTS 5,032,710 A * 7/1991 Nojiri ................ G02B 6/12007
250/226
5,298,739 A * 3/1994 Hiroki ................ G02B 6/12004
257/E31.066
(Continued)

FOREIGN PATENT DOCUMENTS

JP    2000-228531 A    8/2000
JP    2011-512670 A    4/2011
(Continued)

OTHER PUBLICATIONS

International Search Report dated Jul. 30, 2019, issued PCT Application No. PCT/JP2019/019315, filed May 15, 2019.
(Continued)

*Primary Examiner* — Kaveh C Kianni
(74) *Attorney, Agent, or Firm* — Workman Nydegger

(57) ABSTRACT

A photodetector is realized which does not need an additional circuit for an inspection and may perform a characteristic evaluation inspection of optical input and electrical output such as optical sensitivity and OE characteristics of a photodetector alone with respect to wavelength and temperature dependent characteristics. A photodetector is provided in which light absorption layers are formed on a semiconductor substrate, the photodetector detects signal light incident on the light absorption layers from a direction in a substrate surface of the semiconductor substrate, and the light absorption layers have a portion not covered by an electrode for photocurrent detection connected with the light absorption layers in a case where the substrate surface of the semiconductor substrate is seen from a direction from an outside of the substrate surface.

4 Claims, 16 Drawing Sheets

(58) Field of Classification Search
USPC .......................................................... 385/14
See application file for complete search history.

(56) References Cited

U.S. PATENT DOCUMENTS

| | | | | |
|---|---|---|---|---|
| 6,885,075 | B2* | 4/2005 | Kuhara | G02B 6/12004 257/E31.127 |
| 7,043,097 | B2* | 5/2006 | Coldren | G02F 1/0356 385/15 |
| 7,298,937 | B2* | 11/2007 | Keh | H01S 5/02212 385/37 |
| 11,456,392 | B2* | 9/2022 | Jarrahi | H01L 31/032 |
| 2004/0121507 | A1* | 6/2004 | Bude | H01L 27/14649 257/431 |
| 2005/0104684 | A1* | 5/2005 | Wojcik | B82Y 20/00 333/108 |
| 2008/0174736 | A1* | 7/2008 | Huang | G03B 21/14 264/436 |
| 2010/0098373 | A1* | 4/2010 | Hochberg | G02F 1/225 385/2 |
| 2010/0119192 | A1* | 5/2010 | Fujikata | G02B 6/4204 257/E31.127 |
| 2010/0308428 | A1* | 12/2010 | Okamoto | H01L 31/03529 257/E31.127 |
| 2011/0057091 | A1* | 3/2011 | Hochberg | H03B 17/00 250/227.12 |
| 2011/0147870 | A1* | 6/2011 | Ang | H01L 27/1203 257/E31.127 |
| 2015/0372159 | A1* | 12/2015 | Englund | G01J 3/12 250/206 |

FOREIGN PATENT DOCUMENTS

| | | |
|---|---|---|
| JP | 5370857 B2 | 9/2013 |
| JP | 2017-220581 A | 12/2017 |
| JP | 2018-40946 A | 3/2018 |
| WO | 2009/088071 A1 | 7/2009 |

OTHER PUBLICATIONS

Christopher T. DeRose et al., *Ultra Compact 45 GHz CMOS Compatible Germanium Waveguide Photodiode with Low Dark Current*, Optics Express, vol. 19, No. 25, pp. 24897-24904, Dec. 5, 2011.

D. P. Mathur et al., *A New Germanium Photodiode with Extended Long-Wavelength Response*, Applied Optics, vol. 9, No. 8, Aug. 1970, pp. 1842-1847.

* cited by examiner

PHOTODETECTOR

TECHNICAL FIELD

The present invention relates to a photodetector used in an optical communication system or an optical information processing system and particularly relates to a structure for providing a photodetector facilitating an initial inspection in manufacturing.

BACKGROUND ART

Accompanying the spread of optical communication in recent years, cost reduction in an optical communication device has been demanded. As one of solutions, there is a method in which an optical circuit configuring an optical communication device is formed on a large diameter wafer such as a silicon wafer by using a micro optical circuit technique such as silicon photonics. Accordingly, multiple chips of an optical circuit may be formed together, the material price for one chip may considerably be lowered, and cost reduction for the optical communication device may be intended. As a representative photodetector formed on a silicon (Si) substrate by using such a technique, a semiconductor type germanium photodetector (Ge-PD) capable of monolithic integration is raised, for example.

FIG. 1 is a plan view that schematically illustrates a chip structure of a vertical Ge-PD 100 of a waveguide coupling type as one example of a semiconductor type photodetector in related art. FIG. 2 is a sectional view taken along plane II-II (the plane perpendicular to a light traveling direction) in FIG. 1. For easy understanding of the structure, the plan view of FIG. 1 does not illustrate clad layers 101 to 103 and so forth illustrated in the sectional view of FIG. 2 and illustrates only planar regions of portions contacting with semiconductor regions 112, 113, and 115 on the inside of the chip for electrodes 116 to 118.

The Ge-PD 100 is formed by using a lithography technique or the like on an SOI (silicon on insulator) substrate formed of a Si substrate, a Si oxide film, and a surface Si layer. As illustrated in the sectional view of FIG. 2, the Ge-PD 100 is formed on a semiconductor substrate including, from the bottom, the Si substrate 101, the lower clad layer 102 formed of a Si oxide film on the Si substrate 101, and a core layer 110 leading a signal light.

A Ge layer 114 absorbing light is provided on a region of a silicon slab 1102 of the silicon core layer 110 of the semiconductor substrate, and the n-type Ge region 115 is provided on an upper portion of the Ge layer 114 and embedded in the upper clad layer 103 formed of a Si oxide film.

As it may be understood by viewing the plan view of FIG. 1, the core layer 110 in FIG. 2 may be separated into two portions of an input waveguide 1101 on which detected signal light is incident in a direction in a substrate surface and of the silicon slab 1102 on whose center the Ge layer 114 or the like absorbing light is placed.

In FIG. 1, a p-type Si region 111 doped with p-type impurity ions and the p++ silicon electrode units 112 and 113 doped with p-type impurities at a higher concentration and acting as electrodes are formed in the silicon slab 1102, and the electrodes 116 and 118 for photocurrent detection are respectively connected with the electrode units.

The Ge layer 114 as a light absorption layer is laminated on the p-type Si region 111 by epitaxial growth, the n-type Ge region 115 doped with n-type impurities is formed on an upper portion of the Ge layer 114, and the electrode 117 for photocurrent detection is connected with the n-type Ge region 115. The Ge layer 114 and the n-type Ge region 115 together may be referred to as a light absorption layer as the whole.

The Ge-PD 100 as the whole configures a photodiode with the light absorption layer formed on the semiconductor substrate. Signal light as a detection target is incident from the input waveguide 1101 toward the silicon slab 1102 from the direction in the substrate surface. The signal light as the detection target is absorbed mainly by the Ge layer 114, and carriers are produced. A photocurrent flows between the electrode 117 and the electrodes 116 and 118 for photocurrent detection due to the produced carriers, and light is detected by detecting the photocurrent.

Note that although the same applies to the following, semiconductor materials such as silicon and germanium are in general categorized into p-type and n-type whose semiconductor carriers are different in accordance with added doping materials. When a semiconductor region of one type is set as a first semiconductor region and a semiconductor region of the other type is set as a second semiconductor region, the direction of a current and the polarity of a voltage are made opposite, and a configuration is thereby possible in which both of those are exchanged.

CITATION LIST

Patent Literature

Patent Literature 1: Japanese Patent No. 5370857

Non-Patent Literature

Non-Patent Literature 1: C. T. DeRose, D. C. Trotter, W. A. Zortman, A. L. Starbuck, M. Fisher, M. R. Watts, and P. S. Davids1, "Ultra compact 45 GHz CMOS compatible Germanium waveguide photodiode with low dark current", OPTICS EXPRESS, Vol. 19, No. 25, pp. 24897-24904, 5 Dec. 2011.

Non-Patent Literature 2: D. P. Mathur, R. J. McIntyre, and P. P. Webb, "A New Germanium Photodiode with Extended Long-Wavelength Response", APPLIED OPTICS, Vol. 9, No. 8, pp. 1842-1847, August 1970.

SUMMARY OF THE INVENTION

Technical Problem

There is a problem that as is usual with a semiconductor element, a Ge-PD 100 in related art illustrated in FIG. 1 and FIG. 2 has non-uniform light reception performance due to errors or contamination in manufacturing and a so-called faulty product with significantly degraded performance may occur in some cases. A large number of Ge-PDs are integrated in an optical integrated circuit in silicon photonics. Thus, when even one faulty product with poor performance is mixed up with the large number of Ge-PDs at a point of manufacturing, the optical integrated circuit does not operate normally. Thus, the performance of all Ge-PDs is in general evaluated in manufacturing, and the Ge-PDs is determined to be a normal product or a faulty product.

In general, the performance of the Ge-PD to be evaluated in manufacturing includes dark current, optical sensitivity, optical-electrical frequency response (OE) characteristics, and so forth. Among those, because the dark current is an electrical characteristic in a case where optical input is not present, a performance inspection may be performed relatively easily by putting an electric probe on electrodes 116, 117, and 118 in FIG. 1.

Meanwhile, because the optical sensitivity and the OE characteristics are electrical responses to optical input, it is necessary to input light from an input waveguide 1101 in FIG. 1 and extract a signal from the electrodes 116, 117, and 118. However, because the input waveguide 1101 of the Ge-PD as the optical integrated circuit is connected with another optical circuit at a point of manufacturing, an inspection of the performance of the Ge-PD alone may not be performed, and only the total performance of the Ge-PD integrated with other optical circuits may be measured.

In a case where an inspection of the performance of the Ge-PD alone is attempted, in related art, an optical circuit for an inspection has to be newly connected with the individual Ge-PD as illustrated in FIG. 3. In FIG. 3, a Ge-PD 300 is a Ge-PD similar to FIG. 1 and FIG. 2, and a directional coupler 301 and a grating coupler 302 as optical circuits for an inspection are added to an input waveguide 303 side of the Ge-PD 300. The grating coupler 302 is irradiated with light for the inspection (inspection light) from a portion above a substrate surface, the inspection light is supplied to the input waveguide 303 of the Ge-PD 300 via the directional coupler 301, and the Ge-PD 300 may thereby be inspected.

When such an optical circuit for the inspection is added, influences may be caused such as enlargement of the circuit scale of the whole optical integrated circuit and occurrence of optical loss due to a coupler even in an actual operation other than the inspection. Those influences are very small for one Ge-PD; however, because a large number of Ge-PDs are arranged in the whole optical integrated circuit, the influences are accumulated when inspection couplers or the like are added to all of the Ge-PDs and then may not be ignored.

The optical circuits for the inspection such as the above grating coupler 302 and directional coupler 301 have their own wavelength characteristics and temperature dependency. Consequently, there is a problem that when the wavelength characteristics and the temperature dependency of the optical sensitivity or the OE characteristics of the Ge-PD 300 are measured by the light passing through the optical circuit for the inspection in the configuration of FIG. 3, not the performance of the Ge-PD 300 alone but the performance influenced by the optical circuit for the inspection is measured.

The present invention has been made in consideration of such a problem, and one object thereof is to realize a photodetector that does not need an additional circuit for an inspection and may perform a characteristic evaluation inspection of optical input and electrical output such as optical sensitivity and OE characteristics of a Ge-PD alone with respect to wavelength characteristics and temperature dependency.

Means for Solving the Problem

To achieve such an object, the present invention includes the following configurations.

(First Configuration of the Invention)
A photodetector, comprising:
a semiconductor substrate; and
a light absorption layer formed on a semiconductor substrate,
wherein the photodetector detects signal light incident on the light absorption layer from a direction in a substrate surface of the semiconductor substrate; and
the light absorption layer has a region not covered by an electrode for photocurrent detection, the electrode being connected with the light absorption layer, in a case where the substrate surface of the semiconductor substrate is seen from a direction from an outside of the substrate surface.

(Second Configuration of the Invention)
The photodetector described in the first configuration of the invention, in which
the semiconductor substrate includes:
a silicon substrate;
a lower clad layer formed on the silicon substrate;
a silicon core layer formed on the lower clad layer and having a first semiconductor region; and
an input waveguide connected with the silicon core layer and guiding the signal light as a detection target to the silicon core layer from a direction in the substrate surface,
the light absorption layer is formed on the silicon core layer and includes a germanium layer having a second semiconductor region, and
the electrode for photocurrent detection is connected with a portion of the second semiconductor region.

(Third Configuration of the Invention)
The photodetector described in the second configuration of the invention, in which
the electrode for photocurrent detection is arranged in a planar shape that covers all or a portion of sides on an upper surface of the second semiconductor region but does not cover a surface around a central portion on the upper surface.

(Fourth Configuration of the Invention)
The photodetector described in the second configuration of the invention, in which
the electrode for photocurrent detection has a planar shape that is ladder-like or has plural openings.

(Fifth Configuration of the Invention)
The photodetector described in any one of the second to fourth configurations of the invention, in which the electrode for photocurrent detection is provided in a position in which reflection does not occur in a vicinity of the electrode for photocurrent detection in a case where light incident on the germanium layer is propagated through the germanium layer.

(Sixth Configuration of the Invention)
An optical circuit having a polarization diversity configuration, comprising:
a polarization separation-merging circuit;
a polarization rotation circuit for performing polarization rotation between TM polarized light and TE polarized light; and
an optical monitor circuit for branching and receiving a portion of optical power from a main signal route and monitoring power of signal light, wherein
the optical monitor circuit including:
a first monitor light branch circuit provided on a route through which a signal of a TE polarization component passes; and
a second monitor light branch circuit provided on a route through which a signal of a TM polarization component passes, and
the photodetectors described in any one of the first to fifth configurations of the invention are provided, the photodetectors being connected with respective monitor light outputs of the first and second monitor light branch circuits.

(Seventh Configuration of the Invention)

The optical circuit described in the sixth configuration of the invention, in which the optical circuit having the polarization diversity configuration is a light transmission circuit, the light transmission circuit comprising:

an optical power splitter for branching transmission carrier light from a light source;

optical modulation circuits, for the TE polarization component and for the TM polarization component, for performing optical modulation of the branched transmission carrier light by respective electrical signals;

the polarization rotation circuit for performing polarization rotation of an output of the optical modulation circuit for the TM polarization component; and the polarization separation-merging circuit for performing polarization merging of an output of the optical modulation circuit for the TE polarization component and an output of the polarization rotation circuit.

(Eighth Configuration of the Invention)

The optical circuit described in the sixth configuration of the invention, in which the optical circuit having the polarization diversity configuration is a light reception circuit, the light reception circuit comprising:

the polarization separation-merging circuit for performing polarization separation of received signal light, the polarization separation-merging circuit being connected with an input port of the received signal light;

the polarization rotation circuit connected with one output of the polarization separation-merging circuit;

an optical power splitter for branching reference light from a local light source;

an optical coherent mixer for performing optical demodulation for the TE polarization component, the optical coherent mixer being connected with another output of the polarization separation-merging circuit and one output of the optical power splitter;

an optical coherent mixer for performing optical demodulation for the TM polarization component, the optical coherent mixer being connected with an output of the polarization rotation circuit and another output of the optical power splitter; and photodetectors connected with respective demodulated light outputs of the optical coherent mixers for the TE polarization component and for the TM polarization component, and the photodetectors connected with the demodulated light outputs are the photodetector described in any one of the first to fifth configurations of the invention.

Effects of the Invention

As described above, the present invention enables realization of a photodetector that does not need an additional optical circuit for an inspection and may perform characteristic evaluation and inspection of optical input and electrical output such as optical sensitivity and OE characteristics of a Ge-PD alone with respect to wavelength characteristics and temperature dependency.

DESCRIPTION OF EMBODIMENTS

Embodiments of the present invention will hereinafter be described in detail with reference to drawings.

First Embodiment

Figure 4:
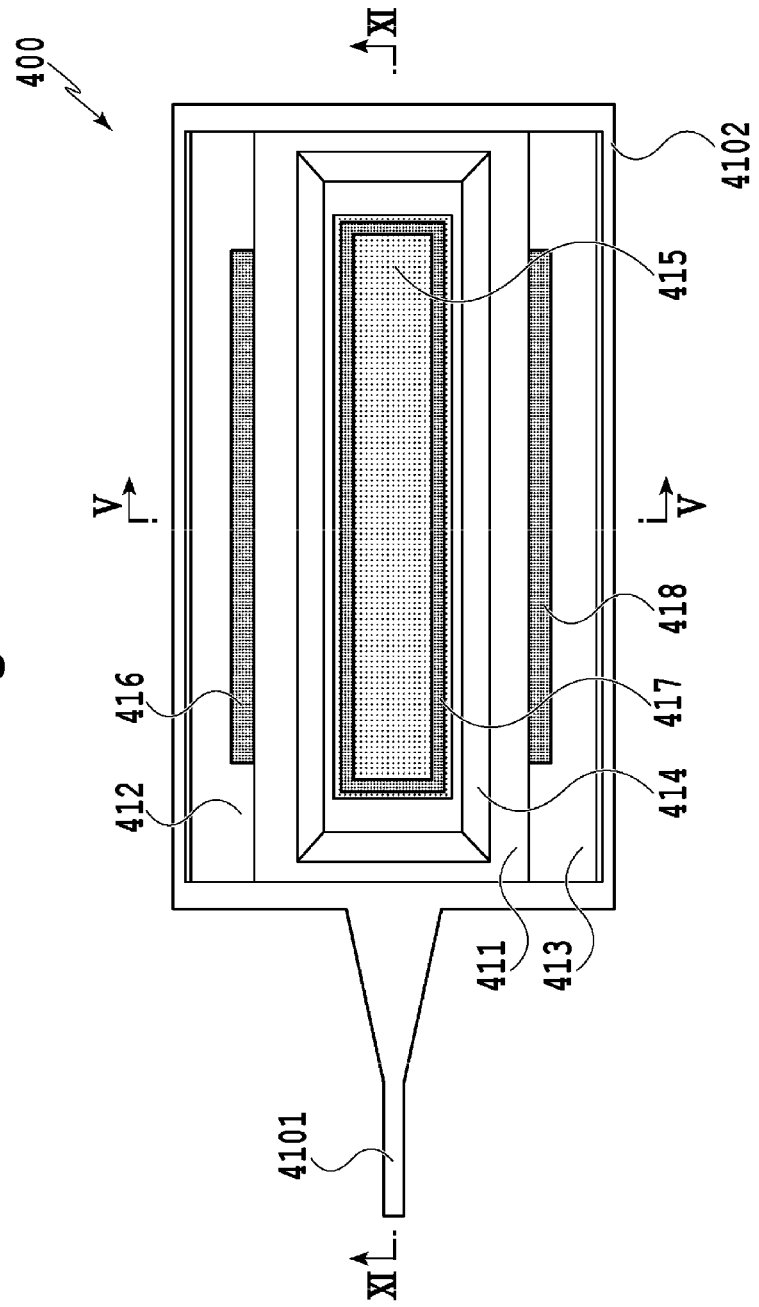
FIG. 4 is a plan view of a first structure example of a first embodiment of a photodetector of the present invention.
Figure 5:
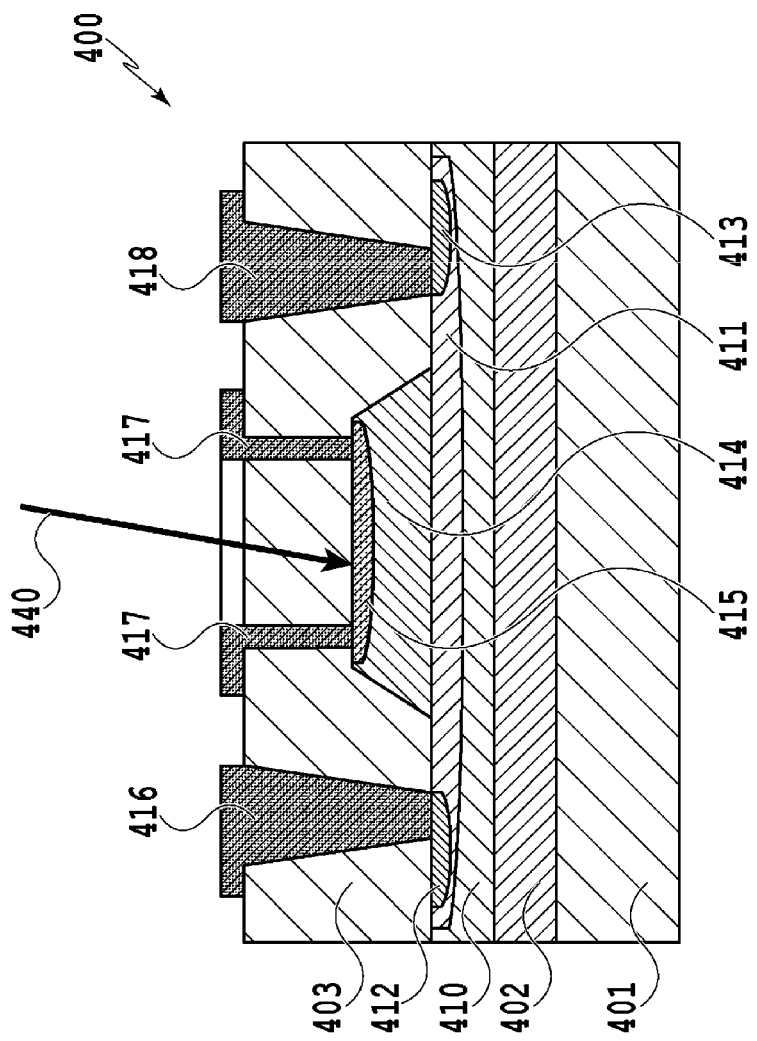
FIG. 5 is a sectional view, perpendicular to a light traveling direction, of the first structure example of the first embodiment of the photodetector of the present invention.

FIG. 4 is a plan view that schematically illustrates a chip structure of a Ge-PD 400 as a first structure example of a first embodiment of a photodetector of the present invention. FIG. 5 is a sectional view taken along plane V-V (the plane perpendicular to a light traveling direction) in FIG. 4.

The Ge-PD 400 of the first structure example illustrated in FIG. 4 and FIG. 5 has an SOI structure similar to related art, for example, and is formed on a semiconductor substrate while including a Si substrate 401, a lower clad layer 402 formed of a Si oxide film, a silicon core layer 410 leading signal light as a detection target, and an input waveguide 4101 guiding the signal light to the silicon core layer from a direction in a substrate surface.

A Ge layer 414 configuring a light absorption layer is provided on a region of a silicon slab 4102 of the silicon core layer 410 of the semiconductor substrate, and an n-type Ge region 415 is provided on an upper portion of the Ge layer 414 and embedded in an upper clad layer 403 formed of a Si oxide film.

As illustrated in FIG. 5, a p-type Si region 411 (first semiconductor region) doped with p-type impurity ions and p++ silicon electrode units 412 and 413 doped with p-type impurities at a higher concentration and acting as electrodes are formed in the silicon slab 4102 of the silicon core layer 410, and electrodes 416 and 418 for photocurrent detection are respectively connected with the electrode units. The Ge layer 414 is laminated on the p-type Si region 411 by epitaxial growth, the n-type Ge region 415 (second semiconductor region) doped with n-type impurities is formed on an upper surface of the Ge layer 414, and the light absorption layer is thereby configured.

Figure 1:
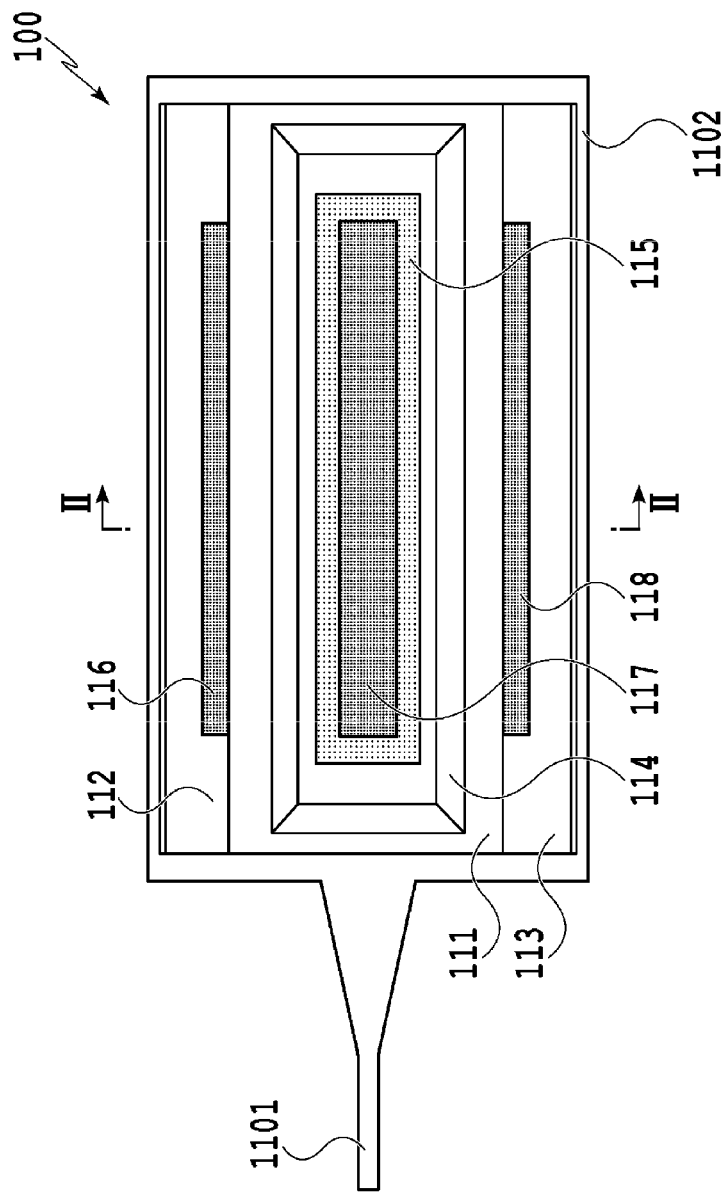
FIG. 1 is a plan view that illustrates a vertical Ge-PD of a waveguide coupling type in related art.
Figure 2:
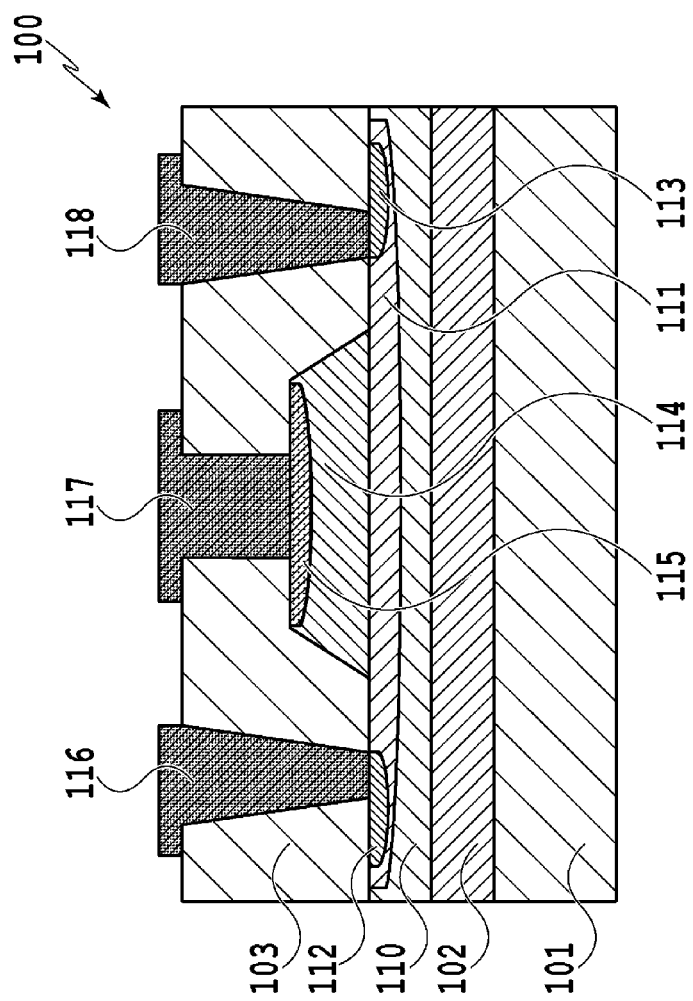
FIG. 2 is a sectional view, perpendicular to a light traveling direction, of the vertical Ge-PD of the waveguide coupling type in related art.

As illustrated in FIG. 4, in the first structure example of the first embodiment of the photodetector of the present invention, the n-type Ge region 415 of the light absorption layer is connected with an electrode 417 for photocurrent detection having a planar shape that is horizontally long hollow rectangle (rectangular frame shape) when the substrate surface is seen from above and has an opening at the center. Differently from a Ge-PD 100 in related art in FIG. 1 and FIG. 2, the photodetector of the present invention has a characteristic that the n-type Ge region 415 as the light absorption layer has a region not covered by the electrode 417 for photocurrent detection connected with the light absorption layer when the substrate surface is seen from a direction from the outside of the substrate surface.

In the Ge-PD 400 of the present invention, an operation that detects signal light by detecting a photocurrent flowing between the electrode 417 and the electrodes 416 and 418 when the signal light is incident on the silicon slab 4102 from the input waveguide 4101 and is absorbed by the Ge layer 414 is not different from a Ge-PD in related art.

In the structure of the Ge-PD of the present invention, because the n-type Ge region 415 as the light absorption layer has an opening region not covered by the electrode 417 for photocurrent detection when the substrate surface is seen from a portion above the substrate surface, it becomes possible to detect inspection light by causing the inspection light to be incident from the direction from the outside of the substrate surface. For example, in FIG. 5, when inspection light 440 is incident on the n-type Ge region 415 from an obliquely upper portion of the substrate surface and is absorbed by the Ge layer 414, a photocurrent flows between electrodes 417 and 416 and 148.

Figure 3:
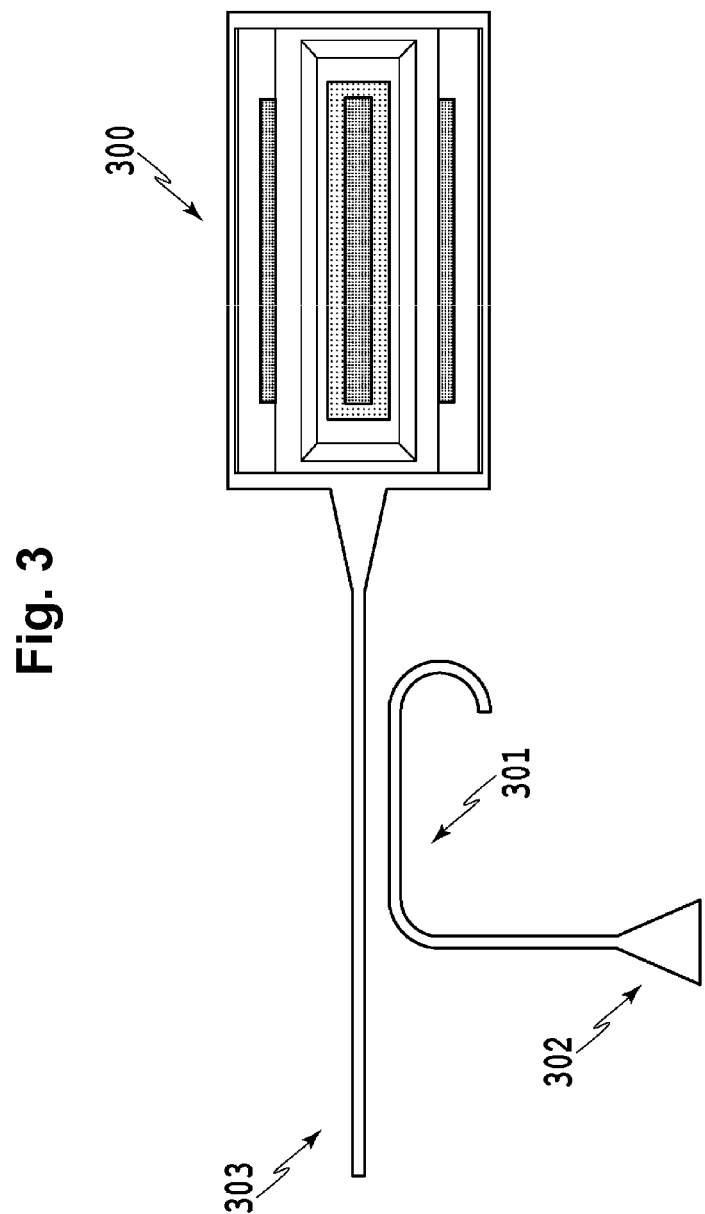
FIG. 3 is a plan view that illustrates a circuit configuration of a Ge-PD in related art with which an optical circuit for an inspection is connected.

The structure of the photodetector of the present invention is different from related art, and light is capable of being incident on the Ge layer 414 without passing through the input waveguide 4101. Thus, the invention of this application has a strong advantage that characteristic evaluation and inspection of optical input and electrical output of the Ge-PD alone as the photodetector may be performed without needing additional optical circuits such as a directional coupler 301 and a grating coupler 302 in FIG. 3.

Further, because the inspection light may directly be introduced into the germanium layer 414, it becomes possible to measure the wavelength characteristics and the temperature dependency of the Ge-PD 400 alone.

Second and Third Structure Examples of First Embodiment

As described above, in the Ge-PD of the present invention, because the n-type Ge region 415 as the light absorption layer is not entirely covered by the electrode 417 for photocurrent detection on the substrate, the inspection light is capable of being incident from the direction from the outside of the substrate surface. The planar shape of the electrode for photocurrent detection is not limited to a hollow rectangular planar shape like the electrode 417 of the first structure example of FIG. 4. For example, a form is possible in which an electrode 517 in the planar shape of a letter U opening toward the light incidence side like a second structure example of FIG. 6, or a form is possible in which an electrode 617 in the planar shape of a letter I is provided only along a short side on an optical end side as in a third structure example of FIG. 7 and contacts with a portion of an n-type Ge region 615.

Figure 6:
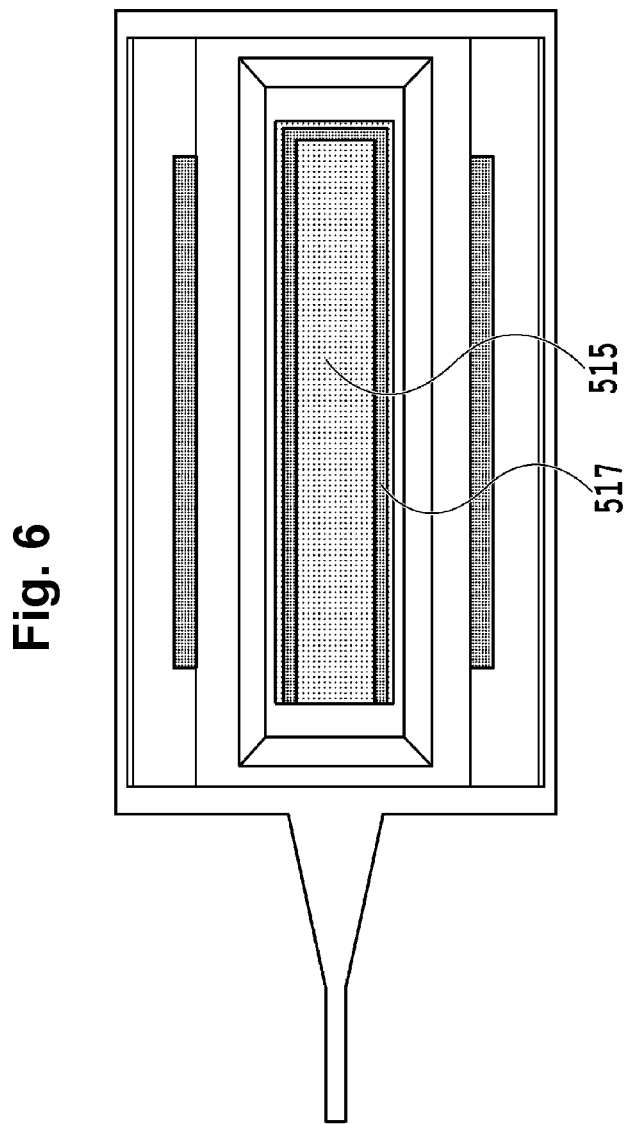
FIG. 6 is a plan view of a second structure example of the first embodiment of the photodetector of the present invention.
Figure 7:
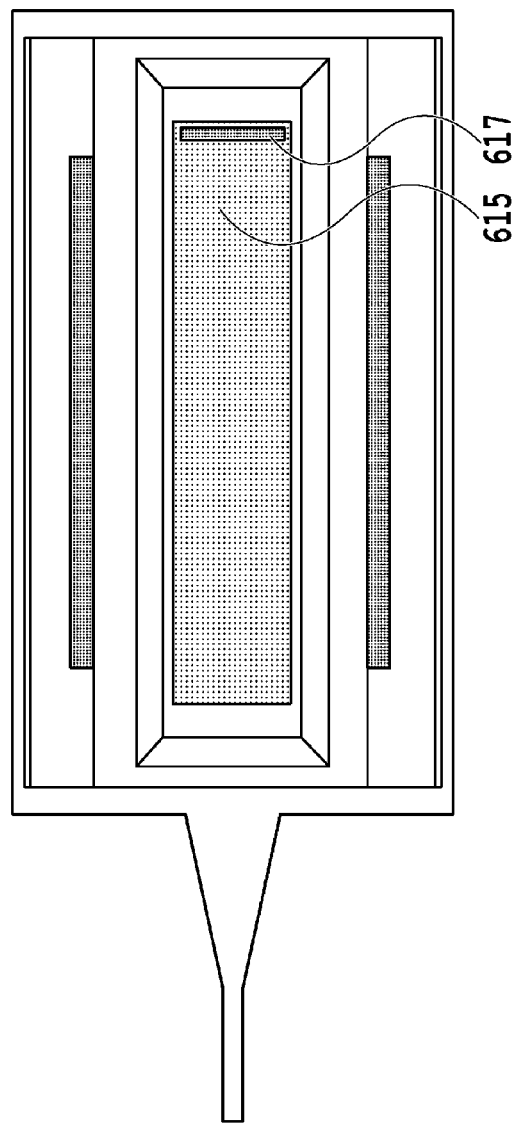
FIG. 7 is a plan view of a third structure example of the first embodiment of the photodetector of the present invention.

In each of the structure examples of FIGS. 4, 6, and 7, because carriers produced by the inspection light incident from an upper surface of an n-type Ge region 415, 515, or 615 pass through the n-type Ge region 415, 515, or 615 and flow to the electrode 417, 517, or 617, each of the structure examples functions as a photodiode.

As described above, in the photodetector of each of the first to third structure examples of the first embodiment, the electrode (417, 517, or 617) for photocurrent detection is arranged so as to cover all or a portion of sides on the upper surface of the second semiconductor region (415, 515, or 615) but so as not to cover a surface around a central portion on the upper surface. The electrode for photocurrent detection may be connected with a portion of the germanium layer other than the second semiconductor region.

Fourth Structure Example of First Embodiment

Figure 8:
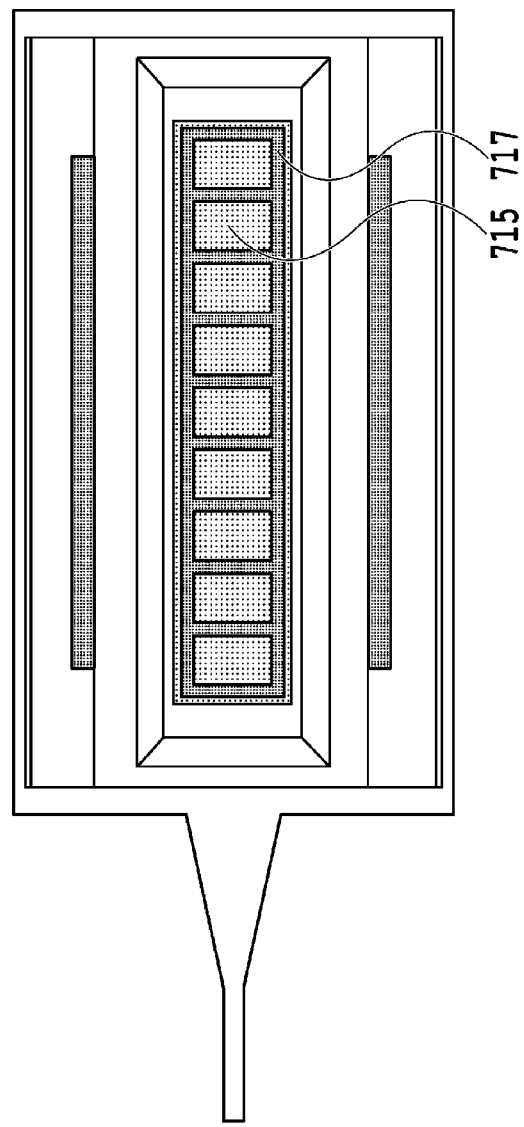
FIG. 8 is a plan view of a fourth structure example of the first embodiment of the photodetector of the present invention.

In addition, as a fourth structure example of FIG. 8, bridges coupling long sides opposed to the electrode 417 as the hollow rectangle (the rectangular frame) of FIG. 4 (first structure example) are attached, and an electrode 717 may thereby be formed which has a ladder-like planar shape or a planar shape having plural openings (holes).

In the electrode shapes such as the first to third structure examples of FIGS. 4, 6, and 7, the traveling time of carriers may increase because produced carriers travel through a long distance in the n-type Ge region and thereafter reach the electrodes 417, 517, and 617, and this results in a fall in frequency characteristics in a high frequency region. The above electrode shape is a measure against such a fall. As the fourth structure example of FIG. 8, the electrode 717 in a ladder-like shape with bridges is formed by providing the plural openings (holes) to the electrode 717, the maximum traveling time of carriers may thereby be decreased, and high frequency characteristics may be improved.

In the fourth structure example with the ladder-like electrode in FIG. 8, because the exposed area of an n-type Ge region 715 is decreased compared to the first to third structure examples, light incidence power in the inspection becomes low. However, because the time in which carriers travel in the n-type Ge region 715 becomes short compared to the other first to third structure examples of the first embodiment, the fourth structure example has a characteristic that the frequency characteristics are less likely to fall.

Characteristics of First Embodiment

Figure 9:
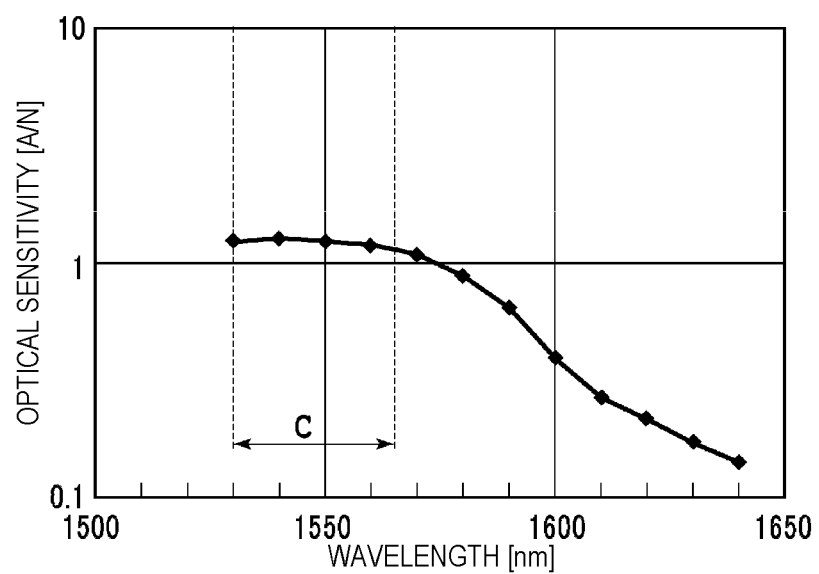
FIG. 9 is a diagram that represents a wavelength characteristic of optical sensitivity of the first structure example of the first embodiment of the photodetector of the present invention.
Figure 10:
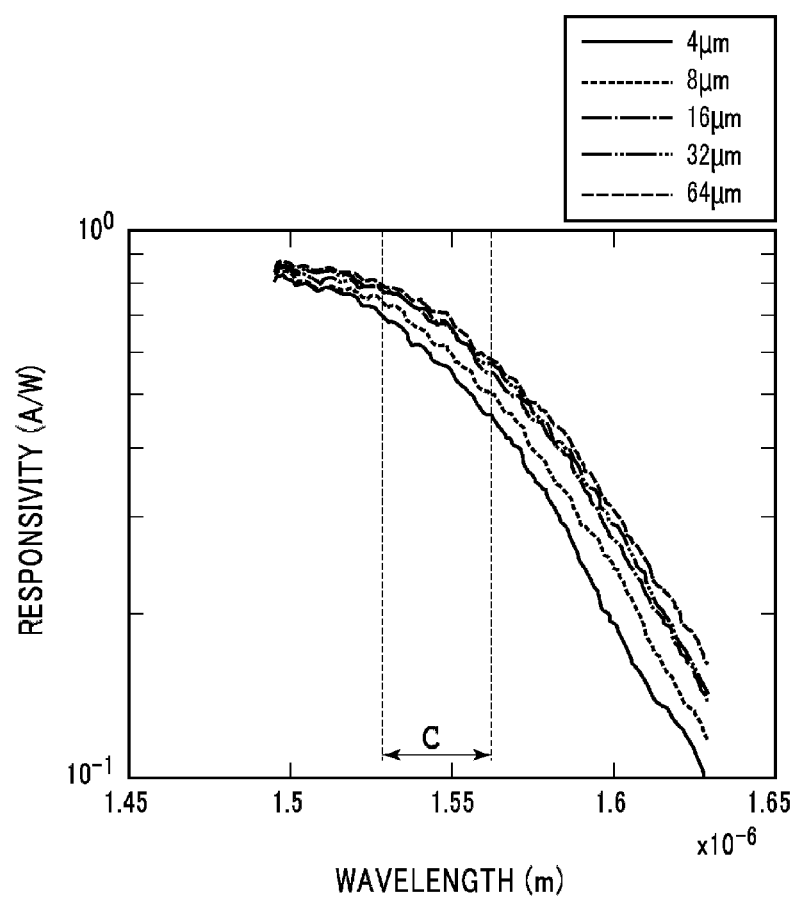
FIG. 10 is a diagram that represents wavelength characteristics of light absorption coefficients of a germanium crystal alone.

FIG. 9 is a diagram that represents a measurement result of a wavelength characteristic of optical sensitivity of the Ge-PD of the first structure example of FIG. 4 in the first embodiment of the present invention. The wavelength characteristic exhibits a form in which the sensitivity decreases as the wavelength becomes longer, and it may be understood that a characteristic in substantially the same tendency may be realized compared to the wavelength characteristics of the light absorption coefficients of a germanium crystal alone, the wavelength characteristics represented in FIG. 10 (cited from Non-Patent Literature 1).

As another effect of the present invention, FIG. 9 shows an effect in which the sensitivity does not largely fall (remaining at a decline of approximately 10%) in a C band of an optical communication wave band of 1,530 to 1,565 nm in the present invention. Compared to the fact that the wavelength characteristics of the optical sensitivity of a germanium crystal alone in FIG. 10 exhibit declines of approximately 30% to 50% in the C band, the Ge-PD of the present invention may be considered to have a relatively flat wavelength characteristic of the optical sensitivity in the C band. This is an effect provided by the fact that the electrode 417 does not cover a portion above the n-type Ge region 415.

Figure 11:
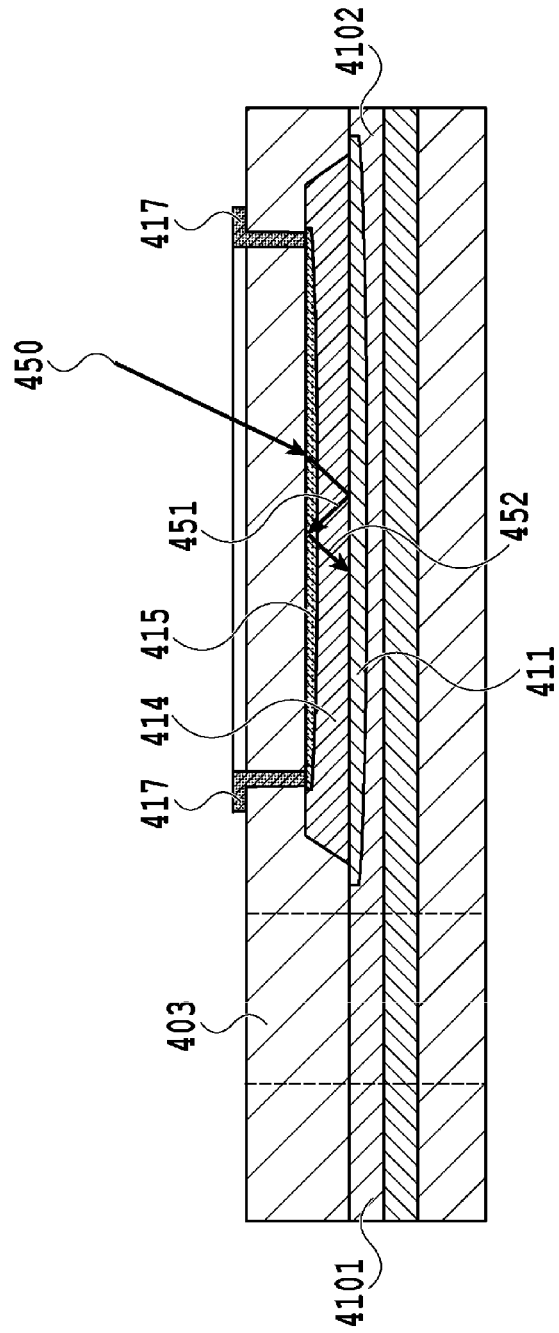
FIG. 11 is a sectional view, in the light traveling direction, of the first structure example of the first embodiment of the photodetector of the present invention.

In the following, the reasons for this effect will be described separately about cases of the inspection light and the signal light with reference to FIGS. 11 and 12. FIG. 11 is a sectional view of the Ge-PD 400 of the first structure example of FIG. 4 in the first embodiment sectioned along substrate section XI-XI in the light traveling direction (the longitudinal direction of an element).

(Case of Inspection Light)

As illustrated in FIG. 11, inspection light 450 incident on the n-type Ge region 415 from an obliquely upper portion of the substrate passes through the Ge layer 414, is reflected by an interface between the Ge layer 414 and the p-type Si region 411, and again returns to the n-type Ge region 415 as light 451. In this case, because the electrode 417 usually configured with metal and also acting as an absorber at wavelengths of optical communication does not contact with the vicinity of a reflection point on the upper surface of the n-type Ge region 415, the light 451 is not absorbed by the electrode 417, is reflected, and again returns to the Ge layer 414 as light 452.

Because more reflections by the n-type Ge region 415 occur on the longer wavelength side on which the light absorption coefficient of germanium falls, sufficient carriers may be produced, the sensitivity does not fall on the long wavelength side in the Ge-PD of the present invention in which light is not absorbed by the electrode 417, and a relatively flat sensitivity spectrum is exhibited.

(Case of Signal Light)

This effect similarly works for the signal light detected by the photodetector. Similarly to FIG. 11, FIG. 12 is a sectional view of the Ge-PD 400 of FIG. 4 sectioned along substrate section XI-XI in the light traveling direction (the longitudinal direction of the element).

Figure 12:
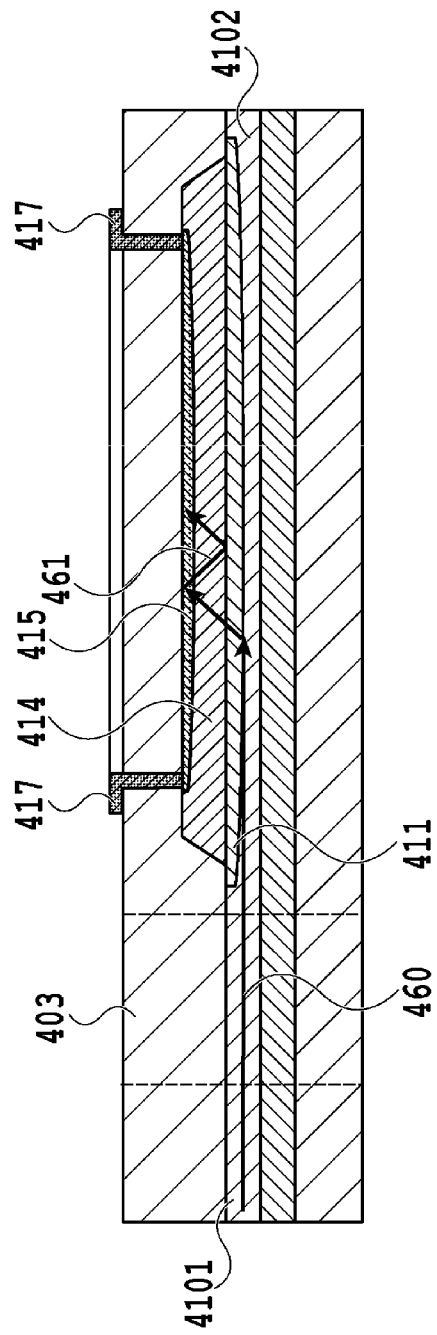
FIG. 12 is a sectional view, in the light traveling direction, of the first structure example of the first embodiment of the photodetector of the present invention.

In FIG. 12, signal light 460 incident from the input waveguide 4101 in the direction in the substrate surface is propagated to the germanium layer 414 and is reflected by the upper surface of the n-type Ge region 415 like light 461. In this case, because the electrode 417 usually configured with metal and also acting as an absorber at wavelengths of optical communication does not contact with the vicinity of a reflection point, light absorption by the electrode 417 does not occur in reflection. Consequently, because loss of the signal light in reflection by the n-type Ge region 415 is reduced and the signal light is propagated through a sufficient distance in the light absorption layer and produces carriers, the sensitivity does not fall on the longer wavelength side in the Ge-PD of the present invention, and a relatively flat sensitivity spectrum is exhibited.

Figure 13:
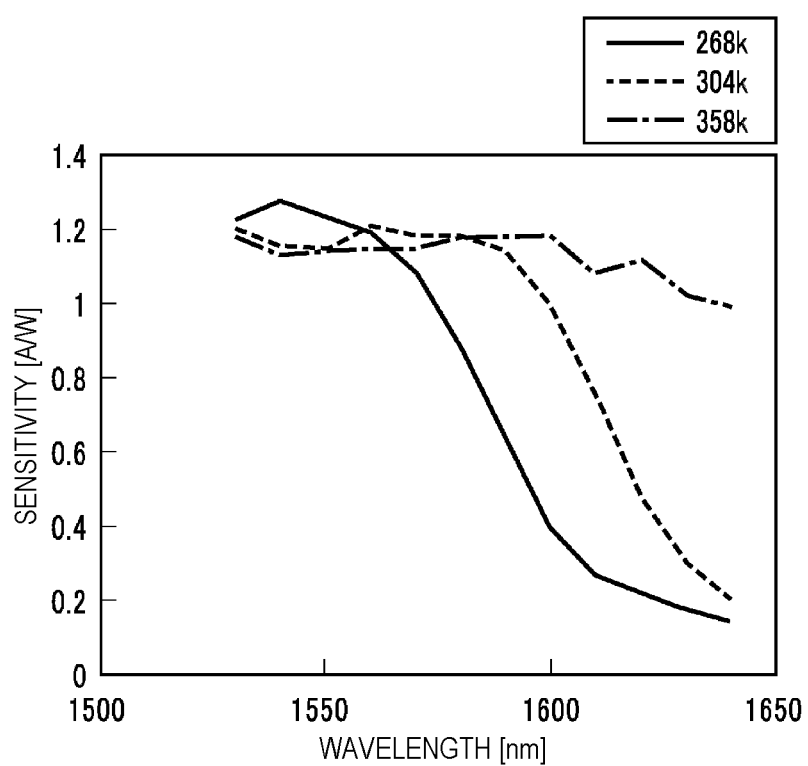
FIG. 13 is a diagram that represents temperature dependency of the wavelength characteristics of the optical sensitivity of the first structure example of the first embodiment of the photodetector of the present invention.
Figure 14:
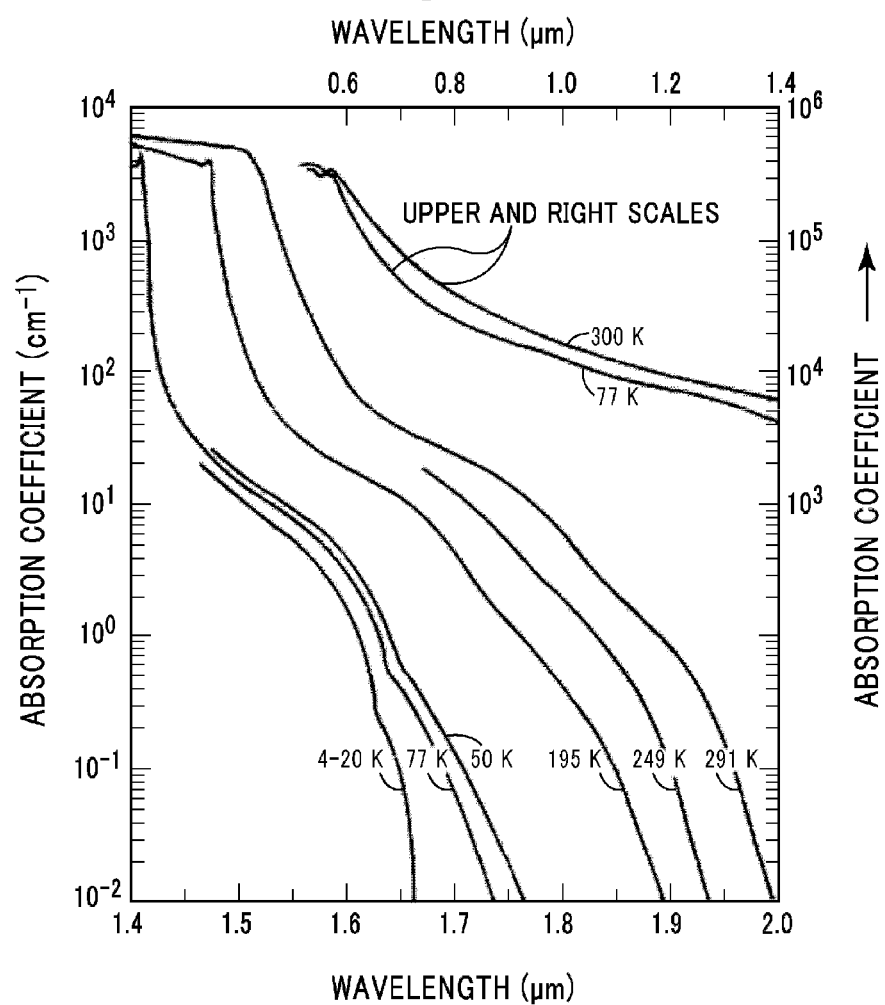
FIG. 14 is a diagram that represents the temperature dependency of the wavelength characteristics of the light absorption coefficients of a germanium crystal alone.

FIG. 13 is a diagram that represents measurement results of the temperature dependency of the wavelength characteristics of the optical sensitivity of the Ge-PD 400 of the present invention in FIG. 4. The wavelength characteristics of the optical sensitivity of the Ge-PD of the present invention exhibit tendencies to change depending on the temperature and to be shifted toward the long wavelength side. This also shows that the same tendencies may be realized as the temperature dependency of the wavelength characteristics of the light absorption coefficients of a germanium crystal alone, the temperature dependency represented in FIG. 14 cited from Non-Patent Literature 2.

As described above, with respect to the wavelength characteristics and the temperature dependency of the photodetector, the photodetector of the first embodiment of the present invention is capable of measuring the performance of the Ge-PD alone by causing the inspection light to be directly incident on the light absorption layer. Further, the photodetector of the present invention has an excellent advantage of having a relatively flat sensitivity spectrum in the C band because the electrode for photocurrent detection is provided in a position in which reflection does not occur in the vicinity of the electrode for photocurrent detection when the light incident on the light absorption layer (germanium layer) is propagated.

Second Embodiment

Figure 15:
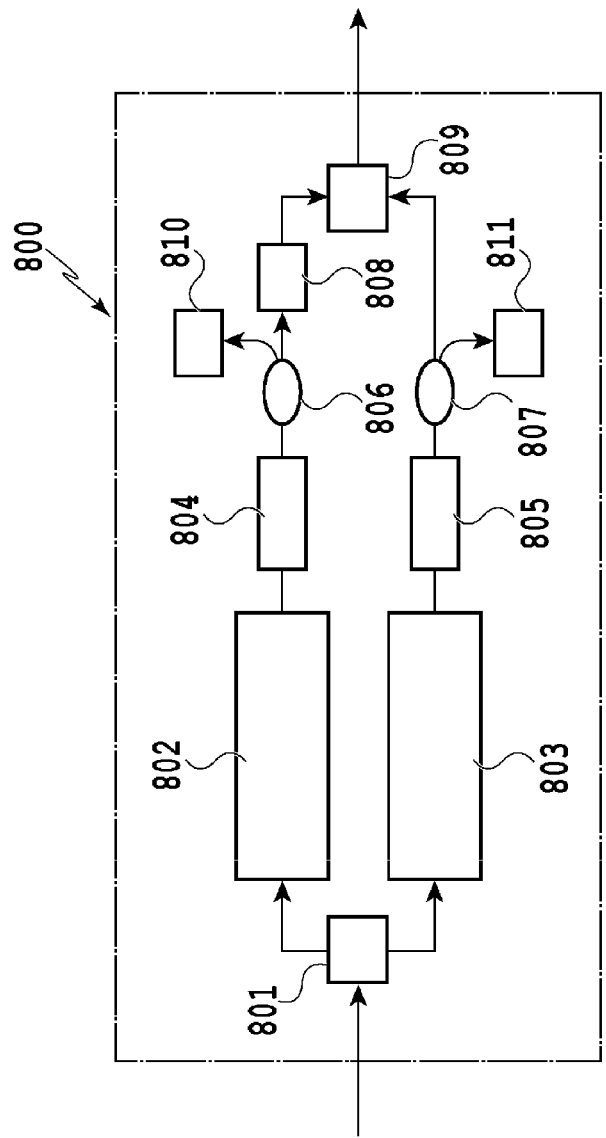
FIG. 15 is a plan view that illustrates a circuit configuration of a second embodiment using the photodetector of the present invention.

FIG. 15 is a diagram that illustrates a configuration of an optical circuit of a second embodiment in which the photodetector in the first embodiment is mounted on a coherent light transmitter in a polarization diversity configuration. FIG. 15 illustrates an optical power splitter 801 branching transmission carrier light from a light source, a Y polarized light modulation circuit 802 and an X polarized light modulation circuit 803 that perform optical modulation of the branched transmission carrier light by respective polarizing electrical signals, a polarization rotator 808 performing polarization rotation from one polarized light to the other polarization, and a polarization beam combiner 809 as a polarization separation-merging circuit performing polarization merging by combining each modulated light of polarization.

In a configuration for a power monitor of a coherent transmitter in FIG. 15, optical outputs of respective modulated optical signals of X and Y polarizations are partially branched as monitor light outputs by monitor light branch circuits 806 and 807 and are received by photodetectors (PD) 810 and 811 of the first embodiment of the present invention. The respective outputs of the photodetectors are applied to variable optical attenuators (VOA) 804 and 805 as optical power monitor outputs, thereby controlling transmission light power.

Third Embodiment

Figure 16:
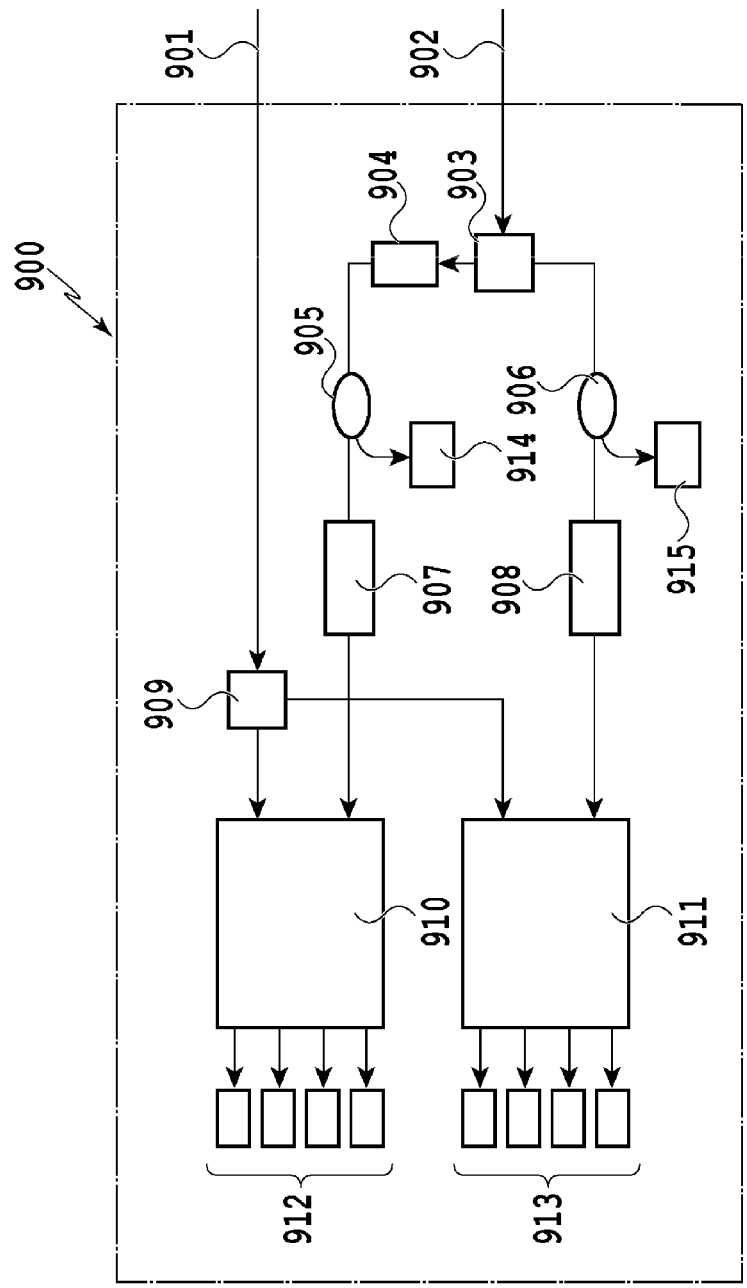
FIG. 16 is a plan view that illustrates a circuit configuration of a third embodiment using the photodetector of the present invention.

FIG. 16 is a diagram that illustrates a configuration of an optical circuit of a third embodiment in which the photodetector in the first embodiment is mounted on a coherent light receiver in a polarization diversity configuration.

FIG. 16 illustrates an optical input route 901 of reference light from a local light source, an input route 902 of received signal light from an input port, a polarization beam splitter 903 as a polarization separation-merging circuit performing polarization separation of the received signal light, and a polarization rotator 904. FIG. 16 also illustrates an optical power splitter 909 for branching the reference light, an optical coherent mixer 910 for Y polarization demodulation, an optical coherent mixer 911 for X polarization demodulation, and PDs 912 and 913 converting demodulated optical signals to electrical signals.

Further, FIG. 16 illustrates monitor light branch circuits 905 and 906, photodetectors (PD) 914 and 915 for power monitors, and variable optical attenuators (VOA) 907 and 908 as a configuration for power monitors of received light. Photodetection outputs of the PDs 914 and 915 are applied to the VOAs 907 and 908, thereby controlling a reception level. The photodetectors of the first embodiment are used for the PDs 912 and 913 and the PDs 914 and 915.

INDUSTRIAL APPLICABILITY

As described above, the present invention enables realization of a photodetector that does not need an additional circuit for an inspection and may perform measurement for a characteristic evaluation inspection of optical input and electrical output such as optical sensitivity and OE characteristics of a photodetector alone with respect to wavelength and temperature dependent characteristics.

REFERENCE SIGNS LIST 100, 300, 400 Ge-PD
101 Si substrate
102 lower clad layer
103 upper clad layer
110 core layer
111, 411 p-type Si region
114, 414 Ge layer
115, 415, 515, 615, 715 n-type Ge region
1101, 303, 4101 input waveguide
1102, 4102 silicon slab
112, 113, 412, 413 p++ silicon electrode unit
116, 117, 118, 416, 417, 418, 517, 617, 717 electrode
301 directional coupler
302 grating coupler
440, 450, 451, 452, 460, 461 light (inspection light, signal light, reflected light)
801, 909 optical power splitter
802, 803 Y (X) polarized light modulation circuit
808, 904 polarization rotator
809 polarization beam combiner
806, 807, 905, 906 light branch circuit
810, 811, 912, 913, 914, 915 PD (photodetector)
804, 805, 907, 908 variable optical attenuator (VOA)
901, 902 optical input route
903 polarization beam splitter
910, 911 Y (X) optical coherent mixer

The invention claimed is:

1. A photodetector comprising:
a semiconductor substrate; and
a light absorption layer formed on the semiconductor substrate,
wherein the photodetector detects signal light incident on the light absorption layer from a direction in a substrate surface of the semiconductor substrate;
the light absorption layer has a region not covered by an electrode for photocurrent detection, the electrode being connected with the light absorption layer, in a case where the substrate surface of the semiconductor substrate is seen from a direction from an outside of the substrate surface wherein
the semiconductor substrate includes:
a silicon substrate;
a lower clad layer formed on the silicon substrate;
a silicon core layer formed on the lower clad layer and having a first semiconductor region; and
an input waveguide connected with the silicon core layer and guiding the signal light as a detection target to the silicon core layer from a direction in the substrate surface,
the light absorption layer is formed on the silicon core layer and includes a germanium layer having a second semiconductor region, and
the electrode for photocurrent detection is connected with a portion of the second semiconductor region.

2. The photodetector according to claim 1, wherein the electrode for photocurrent detection is arranged in a planar shape that covers all or a portion of sides on an upper surface of the second semiconductor region but does not cover a surface around a central portion on the upper surface.

3. The photodetector according to claim 1, wherein the electrode for photocurrent detection has a planar shape that is ladder-like or has plural openings.

4. The photodetector according to claim 1, wherein the electrode for photocurrent detection is provided in a position in which reflection does not occur in a vicinity of the electrode for photocurrent detection in a case where light incident on the germanium layer is propagated through the germanium layer.

* * * * *